United States Patent
Ban

(10) Patent No.: US 6,732,221 B2
(45) Date of Patent: May 4, 2004

(54) WEAR LEVELING OF STATIC AREAS IN FLASH MEMORY

(75) Inventor: Amir Ban, Ramat Hasharon (IL)

(73) Assignee: M-Systems Flash Disk Pioneers LTD, Kfar Saba (IL)

( * ) Notice: Subject to any disclaimer, the term of this patent is extended or adjusted under 35 U.S.C. 154(b) by 135 days.

(21) Appl. No.: 09/870,315

(22) Filed: Jun. 1, 2001

(65) Prior Publication Data

US 2002/0184432 A1 Dec. 5, 2002

(51) Int. Cl.[7] .............................................. G06F 12/00
(52) U.S. Cl. ......................... 711/103; 711/154; 711/165
(58) Field of Search ................................. 711/103, 154, 711/165; 365/185.29, 185.33

(56) References Cited

U.S. PATENT DOCUMENTS

| | | | |
|---|---|---|---|
| 5,341,339 A | 8/1994 | Wells | 365/185.11 |
| 5,388,083 A | 2/1995 | Assar et al. | 365/185.33 |
| 5,404,485 A | 4/1995 | Ban | 711/202 |
| 5,479,638 A | 12/1995 | Assar et al. | 711/103 |
| 5,485,595 A | 1/1996 | Assar et al. | 711/103 |
| 5,530,828 A * | 6/1996 | Kaki et al. | 711/103 |
| 5,568,423 A | 10/1996 | Jou et al. | 365/185.33 |
| 5,748,537 A * | 5/1998 | Garbers et al. | 365/185.33 |
| 5,835,935 A | 11/1998 | Estakhri et al. | 711/103 |
| 5,937,425 A | 8/1999 | Ban | 711/103 |
| 5,956,473 A | 9/1999 | Ma et al. | 714/5 |
| 6,000,006 A * | 12/1999 | Bruce et al. | 711/103 |
| 6,016,275 A | 1/2000 | Han | 365/185.29 |
| 6,026,027 A | 2/2000 | Terrell, II et al. | 365/185.33 |
| 6,081,447 A | 6/2000 | Lofgren et al. | 365/185.02 |
| 6,125,435 A | 9/2000 | Estakhri et al. | 711/201 |
| 6,230,233 B1 | 5/2001 | Lofgren et al. | 711/103 |
| 6,345,001 B1 * | 2/2002 | Mokhlesi | 365/185.33 |
| 6,462,992 B2 * | 10/2002 | Harari et al. | 365/185.33 |

* cited by examiner

*Primary Examiner*—Matthew Kim
*Assistant Examiner*—Stephen Elmore
(74) *Attorney, Agent, or Firm*—Mark M. Friedman

(57) ABSTRACT

An improved method for affecting wear leveling in all units of a flash media, with a considerable decrease in usage of system resources. This is enabled by providing an algorithm that ensures that static areas do not remain static, and that the static data within them is guaranteed to move to other physical locations, such that wear leveling is achieved for all units. The method comprises: launching the wear leveling method once per some large number of write or erase operations done by the Flash data manager; selecting a unit in the media in a manner that successive selections will ultimately select all units; and moving the selected unit data to another free unit, and erasing the selected unit.

7 Claims, 5 Drawing Sheets

WEAR LEVELING OF STATIC AREAS IN FLASH MEMORY

BACKGROUND OF THE INVENTION

1. Field of the Invention

The present invention relates to a method for improving wear leveling of static areas in Flash Memory.

2. Description of the Related Art

Flash memory is non-volatile, able to store recorded data without a power source. Furthermore a computer program using the ability of the Flash memory to be erased and reprogrammed can modify the data stored in Flash memory. These basic capabilities have made Flash arrays suitable for acting as standard storage media in computer systems, i.e. as Flash disks. Several methods have been described in the art of how this can be done, and such methods are in widespread use. Examples of such methods are: U.S. Pat. No. 5,404,485—Flash file system by Amir Ban, incorporated fully herein; and U.S. Pat. No. 5,937,425—Flash file system optimized for page-mode flash technologies by Amir Ban, incorporated fully herein. These two patents describe systems and methods for managing flash file systems, such as coordinating the saving and erasing of data to units. However, these patents do not provide means for wear leveling, as they do not differentiate between frequently and infrequently erased units.

Flash devices are typically divided into several contiguous zones, each of which is individually erasable. Such zones are variously known as units, blocks or sectors in the art, and will be called units, or erase units for clarity, in this disclosure.

A limitation of Flash memory technology is that the number of times a unit can be erased is inherently limited by the physics of the Flash cell. Repeated erasure of a unit wears out the cells in the unit leading to a reduced capability to distinguish between the erased state and the programmed state, resulting in a longer time to erase the unit, appearance of sporadic faults in programming or erasing data, and ultimately the unit may lose entirely the ability to be erased and reprogrammed.

The effects of wear are statistical in nature, and the ability of a Flash device to withstand wear is described by Flash vendors by a number called the program/erase endurance. This number is the minimum or average number of times each Flash unit may be erased without encountering significant failures. Vendor endurance numbers currently range from tens of thousands to a million.

The limited endurance limits the lifetime of a Flash disk. It would be advantageous to have a lifetime that is as long as possible, and this depends on the pattern of access to the Flash disk. Repeated and frequent writes to a single unit, or a small number of units will bring the onset of failures soon and so end the useful lifetime of the media quickly. On the other hand, if writes can be evenly distributed to all units of the media, each unit will experience close to the maximum number of erases it can endure, and so the onset of failures will be delayed as much as possible, maximizing the lifetime of the media.

Flash disk managers take advantage of the fact that their algorithms typically give them discretion over the physical location where new data will be written, and they direct written data in ways designed to guarantee that different Flash units are subjected to the same number of erases. Such a procedure is known in the art as wear leveling. Some managers record the number of erases a unit has experienced in a register in that unit, and enforce a scheme that guarantees that the variation in the number of erases of each unit will not exceed some small constant. Others use a randomization of the choice of the target unit, and depend on statistics and the law of large numbers to maintain an even wear across the Flash media.

An inherent problem for all such wear leveling methods, however, is static areas. Static areas are physical locations on the Flash device that contain data that never or seldom changes. Such data may consist of operating system code or application programs code, which are typically installed once and then never or very seldom change. In many usages of a Flash disk, such data occupies a major part of the Flash media.

Since wear leveling methods exercise their control when choosing a location in which to write new data, they have no influence over the wear experienced by static areas. As these areas are never written to, no choice can be made. While active units of the Flash media may undergo effective wear leveling, the static units, the units of the static areas remain with very low wear. This can significantly reduce the lifetime of the entire Flash media, as for example if static areas span half the media, the effective lifetime is reduced by half.

Furthermore, static areas present various difficulties such as:

1. Identifying static areas, including tracking patterns of usage of the Flash disk by units over long period of time, which is a difficult process requiring control structures and algorithms to support the bookkeeping.
2. Moving the data from a static unit to another location takes time to write the data to its new location and erase the previous location. This represents performance overhead that can degrade the Flash disk throughput if done frequently.
3. Guaranteeing a leveling of wear across the media over time, in spite of the presence of static areas.

Examples of some methods in the art are:

U.S. Pat. No. 5,341,339 by Wells et al., fully incorporated herein by reference, describes a method for wear leveling in a flash EEPROM memory, thus extending significantly the life of a flash memory array. The method of the Wells et al. invention provides for monitoring and subsequently equalizing the switching of different portions of a flash memory array. According to this invention, these and other objects are realized in a process for cleaning up a flash EEPROM memory array separated into blocks which may be separately erased, in which process all valid data on a selected block is first written to other blocks of the array, and then the block is erased, the improvement comprising the step of determining a selected block to clean up based on a comparison of the number of invalid sectors each block includes, and the number of switching operations which each block has undergone. In this way, both maintaining reserve units for recording and maintaining wear leveling are achieved. However, considerable system resources are required to maintain such a system, which includes maintaining an erase count for each unit. In addition, Wells does not really treat static areas. He suggests to give increased weights to the erase count when doing cleanup. In really static areas, there is nothing to clean up, so this is more than setting weights to parameters. Wells omits the crucial step of forcing "cleanup" on units that don't need cleanup, but are static.

U.S. Pat. Nos. 5,388,083, 5,485,595 and 5,479,638, of Assar et al., fully incorporated herein by reference, describe various applications of Flash memory mass storage architecture for wear leveling. According to these patents, an algorithm is provided that prevents any portion of the mass storage from being erased a substantially larger number of times than any other portion. This prevents any one block of the mass storage from failing and becoming unusable earlier than any other block thereby extending the life of the entire mass storage.

Accordingly, a counter tracks the number of times each block is erased. A programmable maximum value for the counter is also provided. As the number of erase cycles for a block becomes one less than the maximum, the block is erased one last time and written with another file having a then smallest number of erase cycles. It is also prevented from being erased thereafter by setting its erase inhibit flag. After all blocks approach this maximum, all the erase counters and inhibit flags are cleared and the second algorithm is then repeated. In this way, no block can be erased a substantial number of times more than any other block. However, like the Wells et al. invention, this invention requires considerable system resources in order to maintain the elaborate monitoring and permissions structure. Furthermore, this invention also omits the crucial step of forcing "cleanup" on units that don't need cleanup, but are static.

There is thus a widely recognized need for, and it would be highly advantageous to have, an improved wear leveling algorithm to deal in an effective and economical manner with static areas so as to maximize the lifetime of the Flash media, while minimizing system.

SUMMARY OF THE INVENTION

According to the present invention there is provided an improved method for affecting wear leveling in all units of a flash media. This is enabled by providing an algorithm that ensures that static areas do not in fact remain static, and that the static data within them is guaranteed to move to other physical locations, such that wear leveling is achieved.

The present invention provides the following method:
1. Once per some large number of write or erase operations done by the Flash data manager, launch the wear leveling method of the present invention according to the subsequent steps.
2. Periodically selecting a unit in the media in a manner that successive selections will ultimately select all units.
3. Moving the selected unit data to another free unit, and erasing the selected unit.

BRIEF DESCRIPTION OF THE DRAWINGS

The invention is herein described, by way of example only, with reference to the accompanying drawing, wherein.

DESCRIPTION OF THE PREFERRED EMBODIMENT

The present invention relates to method for affecting wear leveling in flash media. This is enabled by providing an algorithm that ensures that static areas do not in fact remain static, and that the static data within them is guaranteed to move to other physical locations, such that wear leveling is achieved, requiring a minimal usage of system resources.

The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Specifically, the present invention can be used to improve wear leveling of static blocks in Flash memory devices.

Accordingly, the present invention provides solutions for wear leveling in static and non-static areas, such that wear leveling is achieved:
 i. without the need to recognize which areas are static.
 ii. at very low performance penalty.
 iii. with effective wear leveling producing wear with small variation between units.

Figure 1:
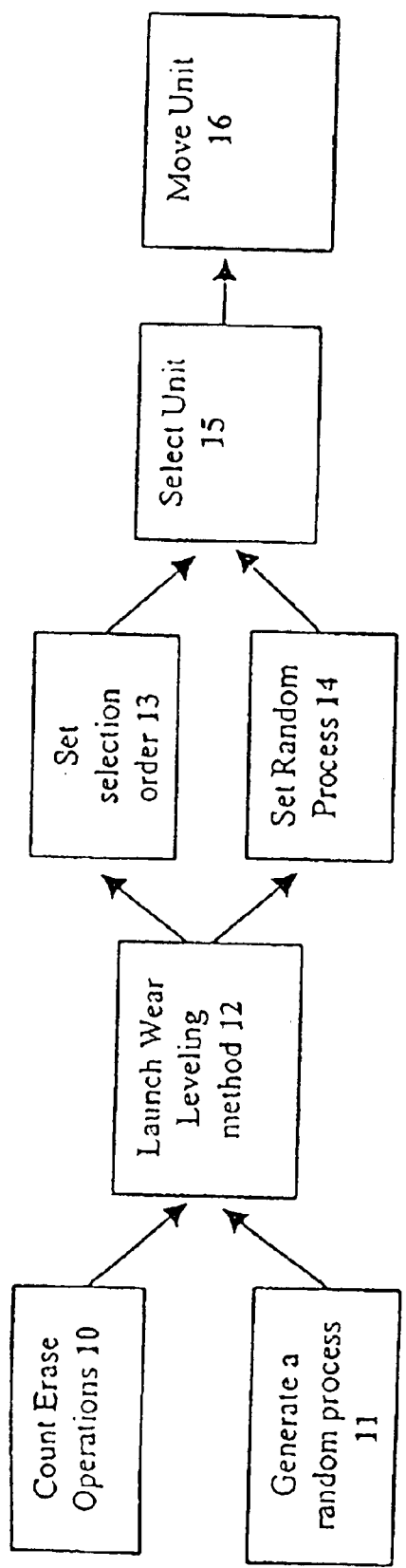
FIG. 1 is an illustration of the method of the present invention.

The principles and operation of a system and a method according to the present invention may be better understood with reference to the figures and the accompanying description, it being understood that these drawings are given for illustrative purposes only and are not meant to be limiting, wherein:

The method is as follows, as can be seen in FIG. 1:
1. At least once per some large number of write or erase operations done by the Flash data manager, launch the wear leveling method 12 of the present invention according to the subsequent steps. For example, this may be done once per 1000 unit erase operations as follows:
   a. By counting write or erase operations 10 and activating when the count is a multiple of a chosen number, such as 1000.
   b. By generating a random process 11 for each write or erase operation whose probability for success is a chosen probability, such as 1 in 1000, and subsequently activating the wear leveling method if the random process succeeds.
2. Select 15 a unit in the media in a manner that successive selections will ultimately select all units, either
   a. By setting a specific order for selection 13, e.g. that units are selected from first to last in physical order and then back to first, so that the unit selected succeeds the unit previously selected, unless the previous unit was the last one, in which case the next unit selected is the first unit in physical order.
   b. By selecting units by a random process 14, which gives equal probability for each unit to be selected.
3. Move the selected unit data to another free unit 16, and erase the selected unit.

In many Flash management algorithms, step 3 already exists as part of the garbage collection algorithm (as is known in the art, as can be seen in the above referenced patents U.S. Pat. Nos. 5,404,485, 5,937,425 and 5,341,339), so for those algorithms, the procedure above is another occasion for activating an existing procedure. It should be appreciated that step 3 can be any similar algorithm that has the effect of moving data away from the unit selected, or triggering this action. For example, in a Flash manager that performs garbage collection for units in order of priority ranking, step 3 may consist of merely boosting the priority of the selected unit and so making it the likely candidate for the being moved next.

FIGS. 2–5 are flowcharts of respective specific embodiments of the method of the present invention.

Figure 2:
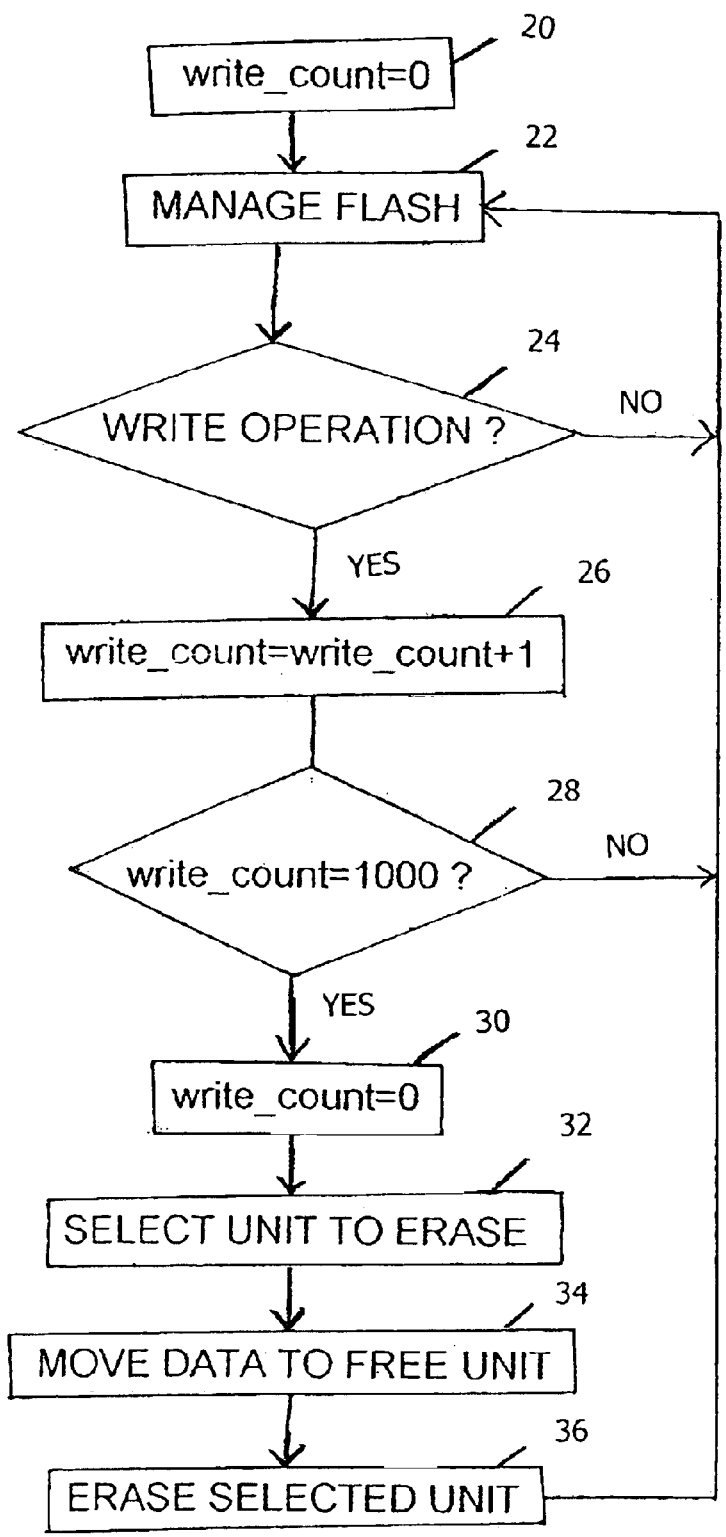
FIGS. 2–5 are flowcharts of specific embodiments of the method of the present invention.

FIG. 2 is a flowchart of an embodiment of the present invention that counts 1000 write operations to determine when to launch wear leveling method 12. In block 20, at the beginning of the management of the flash media, the count of write operations is initialized to zero. Flash management then proceeds in block 22, for example as taught in U.S. Pat. No. 5,404,485 and in U.S. Pat. No. 5,937,425. Whenever the flash data manager performs a write operation (block 24), the count of write operations is incremented (block 26). Whenever the count of write operations reaches 1000 (block 28), the count of write operations is reset to zero (block 30), a unit is selected for erasure (block 32), the data stored in the selected unit are moved to a free unit (block 34) and the selected unit is erased (block 36).

Figure 3:
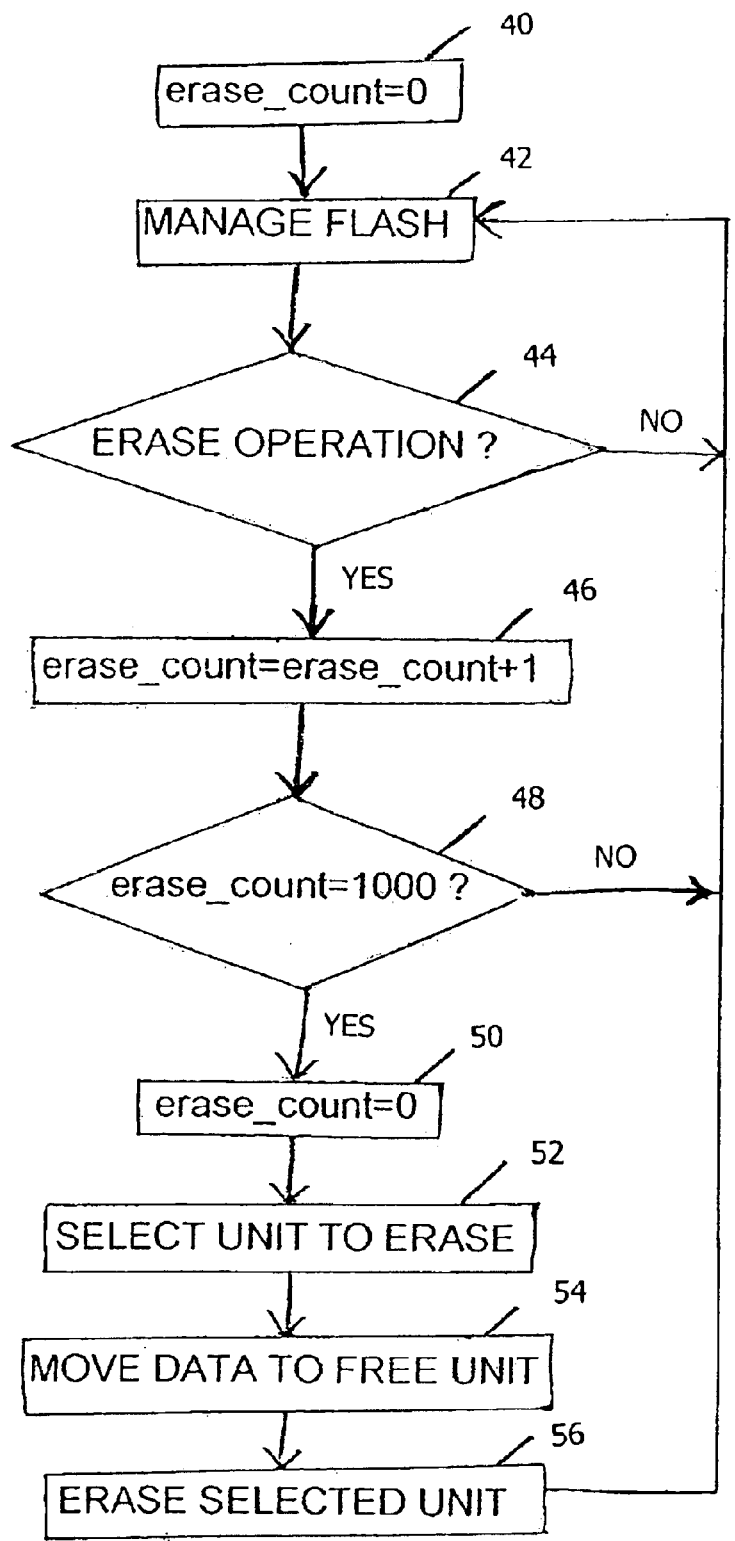

FIG. 3 is a flowchart of an embodiment of the present invention that counts 1000 erase operations to determine when to launch wear leveling method 12. In block 40, at the beginning of the management of the flash media, the count of erase operations is initialized to zero. Flash management then proceeds in block 42, for example as taught in U.S. Pat. No. 5,404,485 and in U.S. Pat. No. 5,937,425. Whenever the hash data manager performs an erase operation (block 44), the count of erase operations is incremented (block 46). Whenever the count of erase operations reaches 1000 (block 48), the count of erase operations is reset to zero (block 50), a unit is selected for erasure (block 52), the data stored in the selected unit are moved to a free unit (block 54) and the selected unit is erased (block 56).

Figure 4:
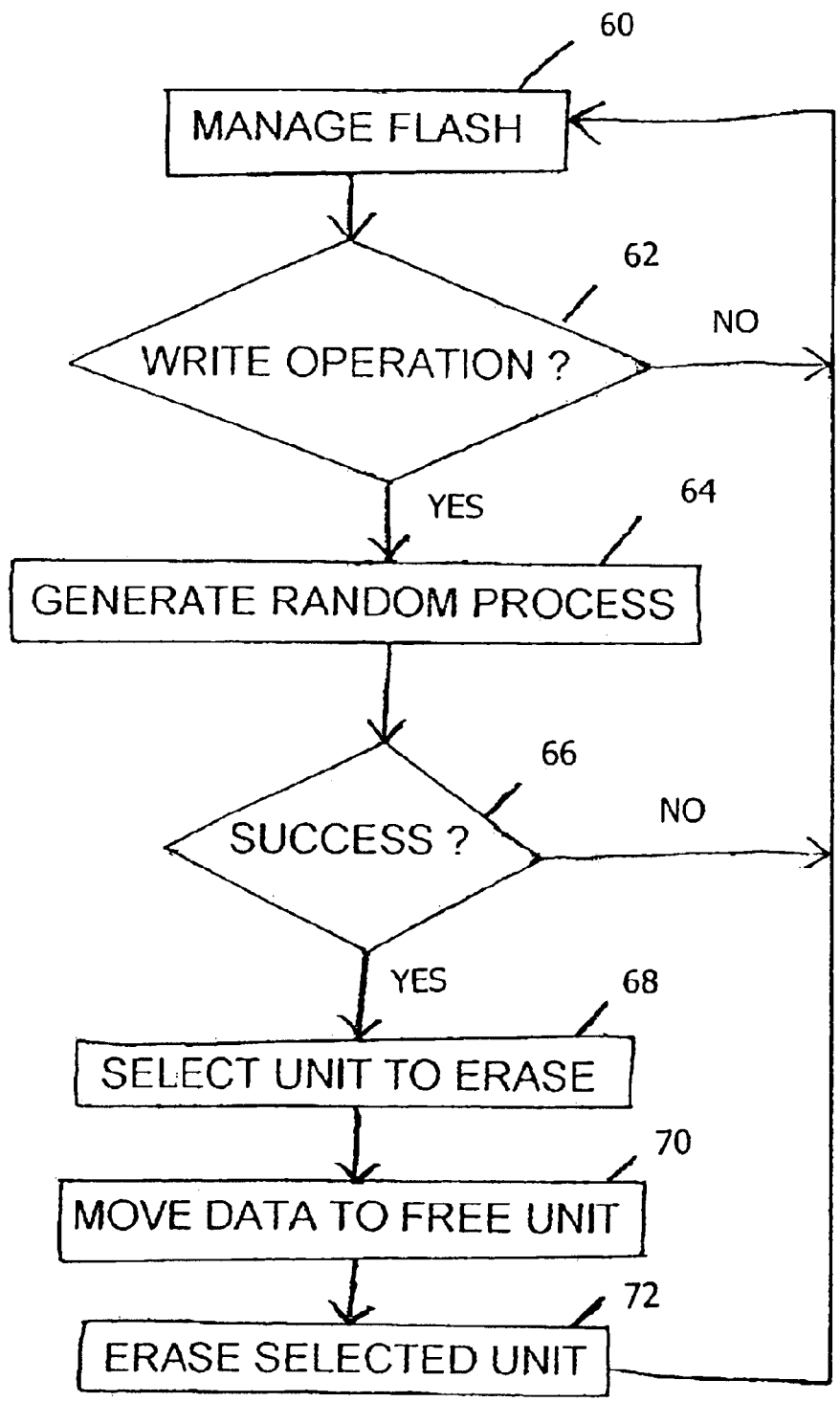

FIG. 4 is a flowchart of an embodiment of the present invention that generates a random process that has a one in 1000 probability of success each time a write operation is performed to determine when to launch wear leveling method 12. Flash management commences in block 60, for example as taught in U.S. Pat. No. 5,404,485 and in U.S. Pat. No. 5,937,425. Whenever the flash data manager performs a write operation (block 62), a random process is generated (block 64). If the random process succeeds (block 66), a unit is selected for erasure (block 68), the data stored in the selected unit are moved to a free unit (block 70) and the selected unit is erased (block 72).

Figure 5:
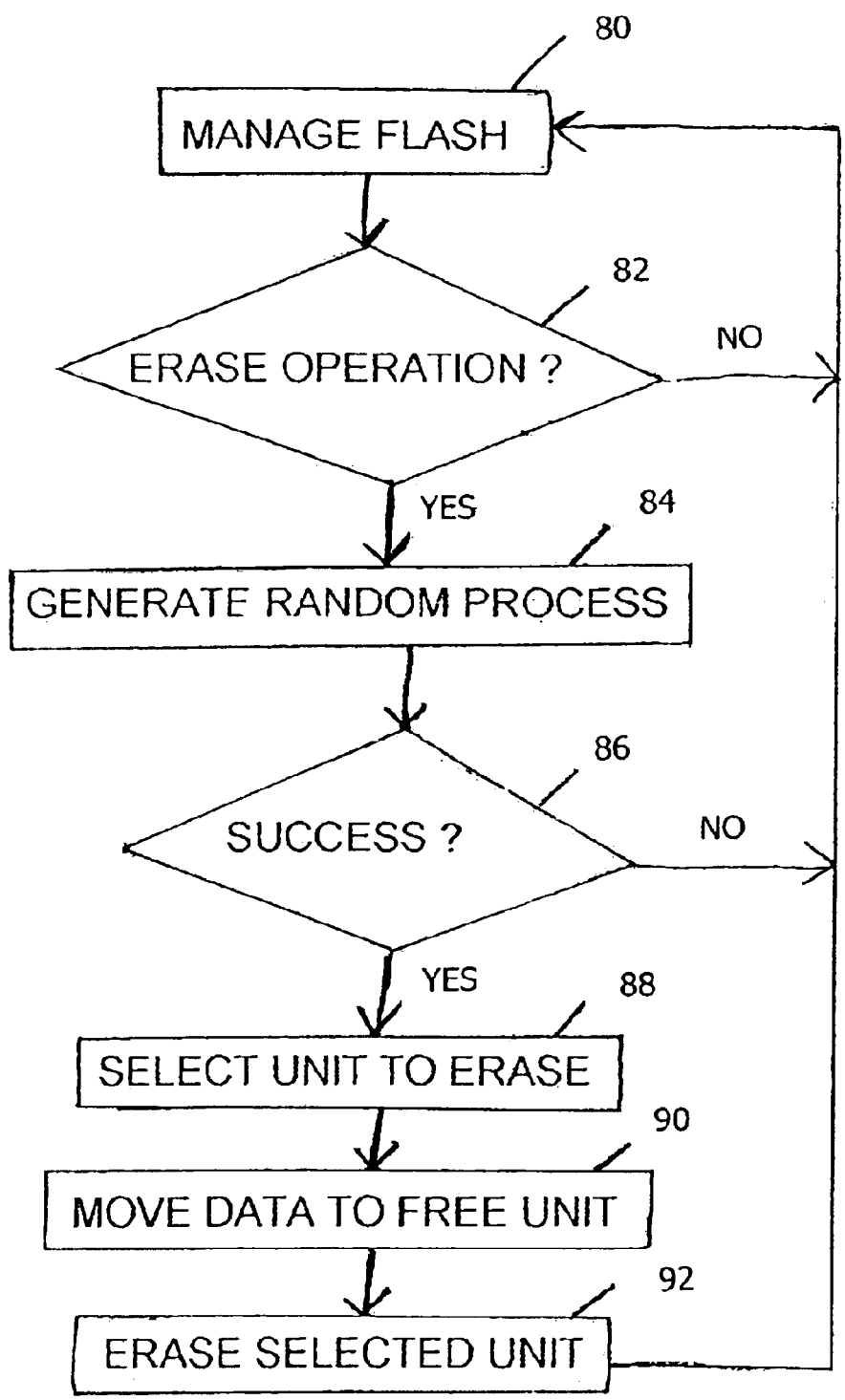

FIG. 5 is a flowchart of an embodiment of the present invention that generates a random process that has a one in 1000 probability of success each time an erase operation is performed to determine when to launch wear leveling method 12. Flash management commences in block 80, for example as taught in U.S. Pat. No. 5,404,485 and in U.S. Pat. No. 5,937,425. Whenever the flash data manager performs an erase operation (block 82), a random process is generated (block 84). If the random process succeeds (block 86), a unit is selected for erasure (block 88), the data stored in the selected unit are moved to a free unit (block 90) and the selected unit is erased (block 92).

It should be noted that because of the low incidence of this method, its overhead has no significant impact on performance. On the other hand, the low incidence is effective enough if each unit is expected to experience it a few hundred times during the entire lifetime of the media, because:

a. If on average a unit will be selected for application several hundred times during the media lifetime, the probability that it will never be selected is very low and can be neglected.

b. A static unit that has been selected has high probability to become a non-static unit. This is because static areas are written once, while non-static areas are written many times, so writes to non-static areas greatly outnumber writes to static areas. It is therefore probable that a unit that becomes free will later become filled by non-static data.

c. Static data selected has a high probability to move to a formerly non-static area (free units almost always occur in non-static areas, the only exception to this occurring through the infrequent application of the current method).

d. The fact that, on average, each unit experiences this selection several hundred times during the lifetime media means that statistically each physical unit is expected to share roles as static and non-static in a uniform ratio.

Assuming write/erase endurance of between 100,000 and 1,000,000 cycles for a unit, applying the method once per 1000 erases, as in the example given, causes each unit to undergo selection between 100 and 1000 times on average, and so is effective in interchanging between static and non-static units during its life-span.

It should be noted that all units, not only static ones, are selected by this method. The selection of an already-active unit does not cause any harm or benefit. The overhead of selecting an already-active unit is not an issue because of the low overhead of the entire procedure, and it saves the overhead and bookkeeping that would be needed to identify the static areas in a media.

ADVANTAGES OF THE INVENTION

The present invention provides a methodology for improving wear leveling for all units, including static units, in a Flash devices, with a substantial decrease in required system resources. This method is operable with the application of a simple algorithm, such that the execution of comprehensive wear leveling is transparent to the user, and negligibly impacts on system overhead.

The foregoing description of the embodiments of the invention has been presented for the purposes of illustration and description. It is not intended to be exhaustive or to limit the invention to the precise form disclosed. It should be appreciated that many modifications and variations are possible in light of the above teaching. It is intended that the scope of the invention be limited not by this detailed description, but rather by the claims appended hereto.

What is claimed is:

1. A method for wear leveling in flash storage media, comprising the steps of:

i. activating the wear leveling method at least once per some number of operations done by a flash data manager;

ii. selecting a unit in the media, independently of how often said unit has been erased and in a manner that successive selections will ultimately select all units;

iii. moving selected unit data from the media to a free unit in the media, and erasing said selected unit.

2. The method of claim 1, wherein said activating is effected at a time determined by one of the methods selected from the group consisting of:

a. counting erase operations to determine when said count is a multiple of a chosen number;

b. counting write operations to determine when said count is a multiple of a chosen number;

c. generating a random process for each erase operation, according to a chosen probability for success; and d. generating a random process for each write operation, according to a chosen probability for success.

3. The method of claim 2, further comprising performing said generation of said some number in a manner designed to be of low incidence relative to the number of write and erase operations that the flash media is subjected to.

4. The method of claim 1, wherein said selecting of said unit is performed in a manner selected from the group consisting of:
   I. setting a specific order for selection; and
   II. selecting units by a random process, such that equal probability is given for each unit to be selected.

5. The method of claim 1, wherein said selected unit is a static unit.

6. A mechanism for ensuring that no erase unit in a flash storage media remains static during a significant portion of the lifespan of the flash storage media containing it, comprising:
   i. a flash storage media for storing data; and
   ii. a computer executable code for ensuring that no erase unit in said flash storage media remains static during a significant portion of the lifespan of said flash storage media, by periodically selecting an erase unit, independently of how often said unit has been erased and in a manner such that successive selections will ultimately select all erase units, moving data from said selected unit to a free unit and erasing said selected erase unit.

7. A mechanism for ensuring that all erase units in a flash storage media are subjected to at least one erase operation during a significant portion of the lifespan of the flash storage media containing it, comprising:
   i. a flash storage media for storing data; and
   ii. a computer executable code for ensuring that all erase units in said flash storage media are subjected to at least one erase operation during a significant portion of the lifespan of said flash storage media, by periodically selecting an erase unit, independently of how often said unit has been erased and in a manner such that successive selections will ultimately select all erase units, moving data from said selected unit to a free unit and erasing said selected erase unit.

* * * * *